United States Patent
Sato (10) Patent No.: US 9,019,714 B2
(45) Date of Patent: Apr. 28, 2015

(54) CIRCUIT COMPONENT AND METHOD OF MAKING THE SAME

(71) Applicant: Hitachi Chemical Co., Ltd., Tokyo (JP)

(72) Inventor: Kazuya Sato, Ibaraki (JP)

(73) Assignee: Hitachi Chemical Company, Ltd., Tokyo (JP)

(*) Notice: Subject to any disclaimer, the term of this patent is extended or adjusted under 35 U.S.C. 154(b) by 181 days.

(21) Appl. No.: 13/661,322

(22) Filed: Oct. 26, 2012

(65) Prior Publication Data
US 2013/0120948 A1 May 16, 2013

(30) Foreign Application Priority Data
Oct. 26, 2011 (JP) ................................ P2011-235145

(51) Int. Cl.
*H05K 1/11* (2006.01)
*H01L 23/00* (2006.01)
(Continued)

(52) U.S. Cl.
CPC .... *H05K 1/11* (2013.01); *H01L 24/81* (2013.01); *H05K 1/0306* (2013.01); *H05K 3/323* (2013.01); *H05K 3/3436* (2013.01); *H01L 2224/29384* (2013.01); *H01L 2224/2939* (2013.01); *H01L 2224/29455* (2013.01); *H01L 2224/29439* (2013.01); *H01L 2224/29447* (2013.01);
(Continued)

(58) Field of Classification Search
CPC ............. C09J 9/02; H01B 1/22; H01L 24/86; H01L 24/81
USPC ......... 361/748, 760, 779, 761, 764, 767, 771, 361/807, 808, 809, 810, 811; 349/139, 152
See application file for complete search history.

(56) References Cited

U.S. PATENT DOCUMENTS

| 5,001,302 A * | 3/1991 | Atsumi ...................... 174/94 R |
| 6,466,294 B1 * | 10/2002 | Yamagishi et al. ........... 349/155 |

(Continued)

FOREIGN PATENT DOCUMENTS

| JP | H0634992 A | 2/1994 |
| JP | H08-78075 A | 3/1996 |

(Continued)

OTHER PUBLICATIONS

Office Action issued in counterpart Japanese application P2012-236903 on Sep. 17, 2013 (no translation available; submitted for certification).

*Primary Examiner* — Angel R Estrada
*Assistant Examiner* — Dimary Lopez Cruz
(74) *Attorney, Agent, or Firm* — Griffin & Szipl, P.C.

(57) ABSTRACT

The present invention provides a circuit component that enables satisfactory connection between a substrate and an IC chip and a method of making the same. The circuit component includes an IC chip and a substrate connected to each other using an electrically conductive adhesive containing electrically conductive particles. Bump electrodes and a non-electrode surface are provided on a mounting surface of the IC chip. The non-electrode surface is a portion of the mounting surface other than a portion where the bump electrodes are formed. Electrically conductive particles are placed in a first state between the surfaces of the substrate and the non-electrode surface so as to be in contact with both surfaces. Electrically conductive particles are placed in a second state between the surfaces of both the substrate and the bump electrodes, so as to be more flattened than the first state and dig into the bump electrodes.

12 Claims, 10 Drawing Sheets (51) Int. Cl.
*H05K 3/32* (2006.01)
*H05K 1/03* (2006.01)
*H05K 3/34* (2006.01)

(52) U.S. Cl.
CPC ......... *H01L2224/2932* (2013.01); *H01L 24/13* (2013.01); *H01L 24/16* (2013.01); H01L 24/29 (2013.01); H01L 24/73 (2013.01); H01L 24/83 (2013.01); *H01L 2224/13144* (2013.01); *H01L 2224/16225* (2013.01); *H01L 2224/2929* (2013.01); *H01L 2224/29311* (2013.01); *H01L 2224/29339* (2013.01); *H01L 2224/29344* (2013.01); *H01L 2224/29347* (2013.01); *H01L 2224/29355* (2013.01); *H01L 2224/29369* (2013.01); *H01L 2224/29387* (2013.01); *H01L 2224/29388* (2013.01); *H01L 2224/29393* (2013.01); *H01L 2224/29411* (2013.01); *H01L 2224/73204* (2013.01); *H01L 2224/81203* (2013.01); *H01L 2224/81345* (2013.01); *H01L 2224/81409* (2013.01); *H01L 2224/83192* (2013.01); *H01L 2924/10253* (2013.01); *H01L 2924/14* (2013.01); *H01L 2924/15788* (2013.01); *H01L 2924/3511* (2013.01); *H01L 2224/29444* (2013.01); *H01L 2224/29469* (2013.01); *H01L 2224/29493* (2013.01); *H01L 2224/2942* (2013.01); *H01L 2224/29484* (2013.01)

(56) References Cited

U.S. PATENT DOCUMENTS

| 6,801,289 | B2 * | 10/2004 | Ichioka et al. | 349/152 |
| 7,635,862 | B2 * | 12/2009 | Takano et al. | 257/59 |
| 7,916,262 | B2 * | 3/2011 | Liu et al. | 349/150 |
| 7,935,892 | B2 * | 5/2011 | Nishikawa et al. | 174/260 |
| 2009/0103037 | A1 * | 4/2009 | Abe et al. | 349/150 |

FOREIGN PATENT DOCUMENTS

| JP | 10-134634 A | 5/1998 |
| JP | 2000-323523 A | 11/2000 |
| JP | 2002-231763 A | 8/2002 |
| JP | 2004-035686 A | 2/2004 |
| JP | 2006206833 | 8/2006 |
| JP | 2008-210908 A | 9/2008 |
| JP | 2010-251789 A | 11/2010 |
| JP | 2011-109149 A | 6/2011 |
| WO | 0074203 A1 | 12/2000 |

* cited by examiner

CIRCUIT COMPONENT AND METHOD OF MAKING THE SAME

This application claims priority from Japanese Patent Application No. P2011-235145, filed Oct. 26, 2011, the entire disclosure of which is incorporated herein by reference.

BACKGROUND OF THE INVENTION

1. Field of the Invention

The present invention relates to a circuit component and a method of making the same.

2. Related Background Art

When a circuit component is made by connecting a substrate such as a glass panel for liquid crystal display and an IC chip such as an IC for liquid crystal driving to each other, an electrically conductive adhesive containing electrically conductive particles may be used in some cases. In the case where the electrically conductive adhesive is used to make the circuit component, a plurality of bump electrodes provided to the IC chip can be connected to the substrate at a time. For example, according to Japanese Patent Laid-Open No. 2010-251789, an LCD panel and an IC chip are joined to each other using an anisotropic conductive film containing electrically conductive particles and a light curing resin. Specifically, ultrasonic waves are applied before the LCD panel and the IC chip are brought into pressurized contact with each other with the intermediation of the anisotropic conductive film. After the application of the ultrasonic waves, the anisotropic conductive film is irradiated with light while the LCD panel and the IC chip are in pressurized contact with each other with the intermediation of the anisotropic conductive film, whereby warpage of the LCD panel is suppressed.

SUMMARY OF THE INVENTION

In recent years, growing in size and reduction in thickness of substrates and IC chips have been advancing. Large and thin substrates and IC chips deform easily. If such an IC chip and a substrate are connected to each other using an electrically conductive adhesive, the substrate and the IC chip are pulled toward each other by thermal shrinkage or cure shrinkage of the electrically conductive adhesive that fills a portion in which bump electrodes are not provided, and the substrate and the IC chip deform such that the interval therebetween becomes smaller in the portion in which the bump electrodes are not provided, so that warpage occurs wholly. If the warpage of the substrate and the IC chip occurs, the interval between the bump electrodes and the substrate may be larger in a portion in which the interval between the substrate and the IC chip is larger, the bump electrodes and the substrate may not be in sufficient contact with each other, and satisfactory connection between the substrate and the IC chip may not be obtained.

The present invention has been made in order to solve such a problem, and therefore has an object to provide a circuit component that enables satisfactory connection between a substrate and an IC chip and a method of making the same.

A circuit component of one aspect of the present invention is a circuit component including an IC chip and a substrate that are connected to each other using an electrically conductive adhesive containing electrically conductive particles. The IC chip has a mounting surface on which a bump electrode and a non-electrode surface are provided, the non-electrode surface being a portion of the mounting surface other than a portion in which the bump electrode is formed. Electrically conductive particles in a first state exist between a surface of the substrate and the non-electrode surface, the first state being a state in which the electrically conductive particles are in contact with both the surface of the substrate and the non-electrode surface. Electrically conductive particles in a second state exist between the surface of the substrate and the bump electrode, the second state being a state in which the electrically conductive particles are placed so as to be more flattened than the first state and dig into the bump electrode.

According to the circuit component of the one aspect of the present invention, at the time of making the circuit component, when the substrate and the IC chip are pulled toward each other and thus deformed by thermal shrinkage or cure shrinkage of the electrically conductive adhesive that fills the space between the surface of the substrate and the non-electrode surface, the electrically conductive particles in the first state that are placed so as to be in contact with both the surface of the substrate and the non-electrode surface counteract the deformation of the substrate and the IC chip, and the warpage of the substrate and the IC chip is suppressed. Consequently, the interval between the surface of the substrate and the bump electrode is suppressed from becoming larger, and the bump electrode and the substrate are satisfactorily connected to each other by the electrically conductive particles in the second state that are placed so as to dig into the bump electrode. As a result, the substrate and the IC chip can be satisfactorily connected to each other.

Further, a circuit component of another aspect of the present invention is a circuit component including an IC chip and a substrate that are connected to each other using an electrically conductive adhesive containing electrically conductive particles. The IC chip has a mounting surface on which a bump electrode and a non-electrode surface are provided, the non-electrode surface being a portion of the mounting surface other than a portion in which the bump electrode is formed. Electrically conductive particles having a size in a height direction of the bump electrode exist between a surface of the substrate and the non-electrode surface, the size being substantially coincident with an interval between the surface of the substrate and the non-electrode surface.

According to the circuit component of the another aspect of the present invention, the electrically conductive particles having the size in the height direction of the bump electrode exist between the surface of the substrate and the non-electrode surface, the size being substantially coincident with the interval between the surface of the substrate and the non-electrode surface, and the electrically conductive particles are sandwiched between the surface of the substrate and the non-electrode surface. Accordingly, when the substrate and the IC chip are pulled toward each other and thus deformed by thermal shrinkage or cure shrinkage of the electrically conductive adhesive that fills the space between the surface of the substrate and the non-electrode surface, the electrically conductive particles sandwiched between the surface of the substrate and the non-electrode surface counteract the deformation of the substrate and the IC chip, and the warpage of the substrate and the IC chip is suppressed. Consequently, the interval between the surface of the substrate and the bump electrode is suppressed from becoming larger, and the bump electrode and the substrate are satisfactorily connected to each other. As a result, the substrate and the IC chip can be satisfactorily connected to each other.

Note that the substrate may be a glass substrate. In this case, the glass substrate and the IC chip can be satisfactorily connected to each other.

A method of making a circuit component of one aspect of the present invention is a method of making a circuit component, including connecting an IC chip and a substrate to each other using an electrically conductive adhesive containing electrically conductive particles, the method further including: interposing the electrically conductive adhesive containing the electrically conductive particles between a surface of the substrate and the IC chip, the electrically conductive particles having an average particle diameter larger than a height of a bump electrode of the IC chip; and then pressure-bonding the substrate and the IC chip to each other.

According to the method of making a circuit component of the one aspect of the present invention, the substrate and the IC chip are connected to each other using the electrically conductive adhesive containing the electrically conductive particles having the average particle diameter larger than the height of the bump electrode of the IC chip. Accordingly, the electrically conductive particles interposed between: a non-electrode surface that is a portion of a mounting surface of the IC chip other than a portion in which the bump electrode is formed; and the surface of the substrate are compressed to the height of the bump electrode, and are sandwiched between the non-electrode surface and the surface of the substrate. Accordingly, when the substrate and the IC chip are pulled toward each other and thus deformed by thermal shrinkage or cure shrinkage of the electrically conductive adhesive that fills the space between the surface of the substrate and the non-electrode surface, the electrically conductive particles sandwiched between the non-electrode surface and the surface of the substrate counteract the deformation of the substrate and the IC chip, and the warpage of the substrate and the IC chip is suppressed. Consequently, the interval between the bump electrode and the substrate is suppressed from becoming larger, and the bump electrode and the substrate are satisfactorily connected to each other. As a result, the substrate and the IC chip can be satisfactorily connected to each other.

Here, the electrically conductive adhesive may be interposed such that a thickness of the electrically conductive adhesive before the pressure-bonding is 80% or more and 200% or less of the average particle diameter of the electrically conductive particles. Within this range, the amount of the adhesive that is pushed away by the bump electrode at the time of the pressure-bonding corresponds to a height that is substantially the same as the average particle diameter of the electrically conductive particles, resulting in a reduction of the amount of the electrically conductive adhesive that flows out from between the bump electrode and the substrate to a lateral portion of the bump electrode. Consequently, the electrically conductive particles can be satisfactorily interposed between the bump electrode and the substrate. As a result, the substrate and the IC chip can be satisfactorily connected to each other.

Further, the substrate and the IC chip may be pressure-bonded to each other such that an interval after the pressure-bonding between: a non-electrode surface that is a portion of a mounting surface of the IC chip other than a portion in which the bump electrode is formed; and the surface of the substrate is 70% or more and 100% or less of a maximum particle diameter of electrically conductive particles other than electrically conductive particles whose particle diameter is in the top 1%, of all the electrically conductive particles. Within this range, the electrically conductive particles are satisfactorily sandwiched between the non-electrode surface and the surface of the substrate. Accordingly, even if the substrate and the IC chip are pulled toward each other by thermal shrinkage or cure shrinkage of the electrically conductive adhesive, the electrically conductive particles sandwiched therebetween further counteract the deformation of the substrate and the IC chip, and the warpage of the substrate and the IC chip is suppressed. As a result, the substrate and the IC chip can be more satisfactorily connected to each other.

Still further, the substrate and the IC chip may be pressure-bonded to each other such that a size after the pressure-bonding in the height direction of the bump electrode, of the electrically conductive particles interposed by the pressure-bonding between the bump electrode and the surface of the substrate is 15% or more and 80% or less of the average particle diameter of the electrically conductive particles. Within this range, the pressure-bonding enables the electrically conductive particles to satisfactorily dig into the bump electrode, and the substrate and the IC chip can be satisfactorily connected to each other.

According to the present invention, it is possible to provide a circuit component that enables satisfactory connection between a substrate and an IC chip and a method of making the same.

DESCRIPTION OF THE PREFERRED EMBODIMENTS

Hereinafter, a circuit component and a method of making the same according to an embodiment of the present invention are described in detail with reference to the drawings.

[Substrate and IC Chip]

Figure 1:
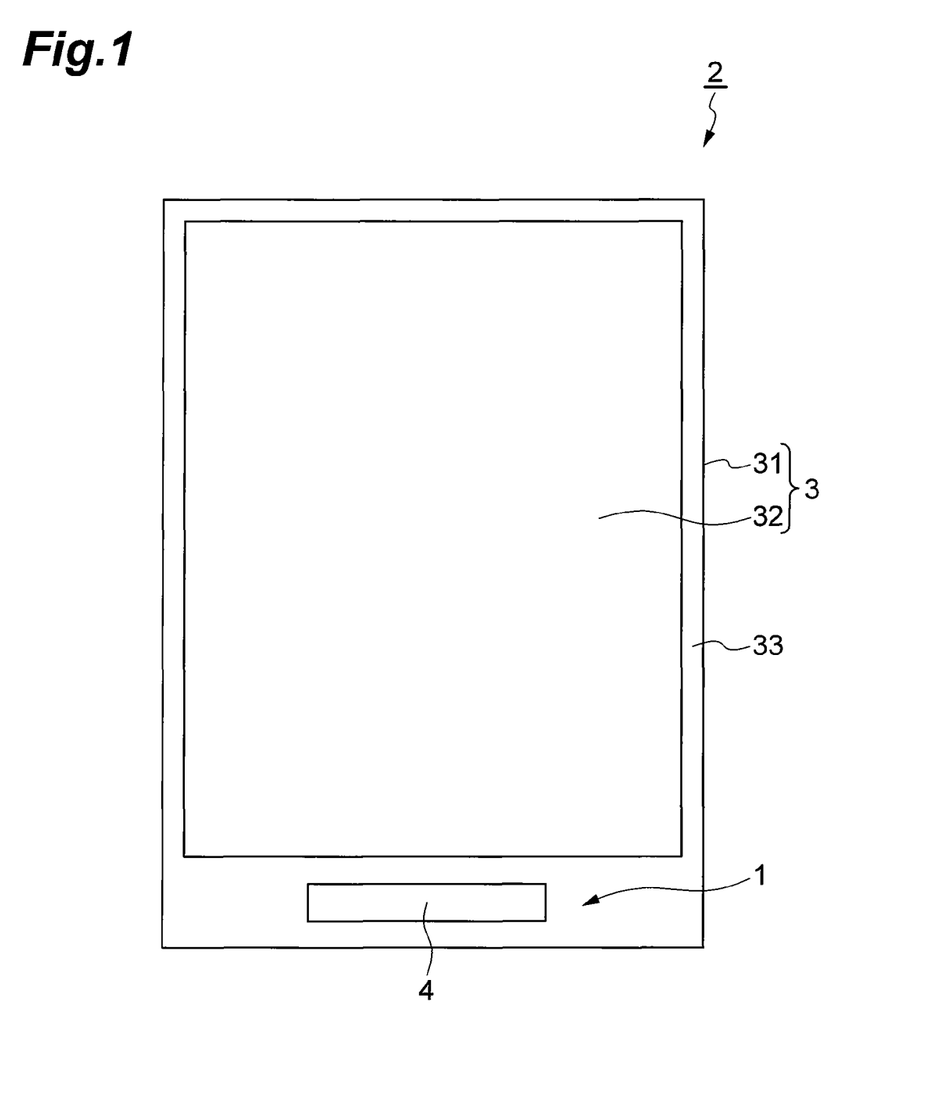
FIG. 1 is a plan view illustrating an electronic device to which a circuit component according to an embodiment of the present invention is applied.
Figure 2:
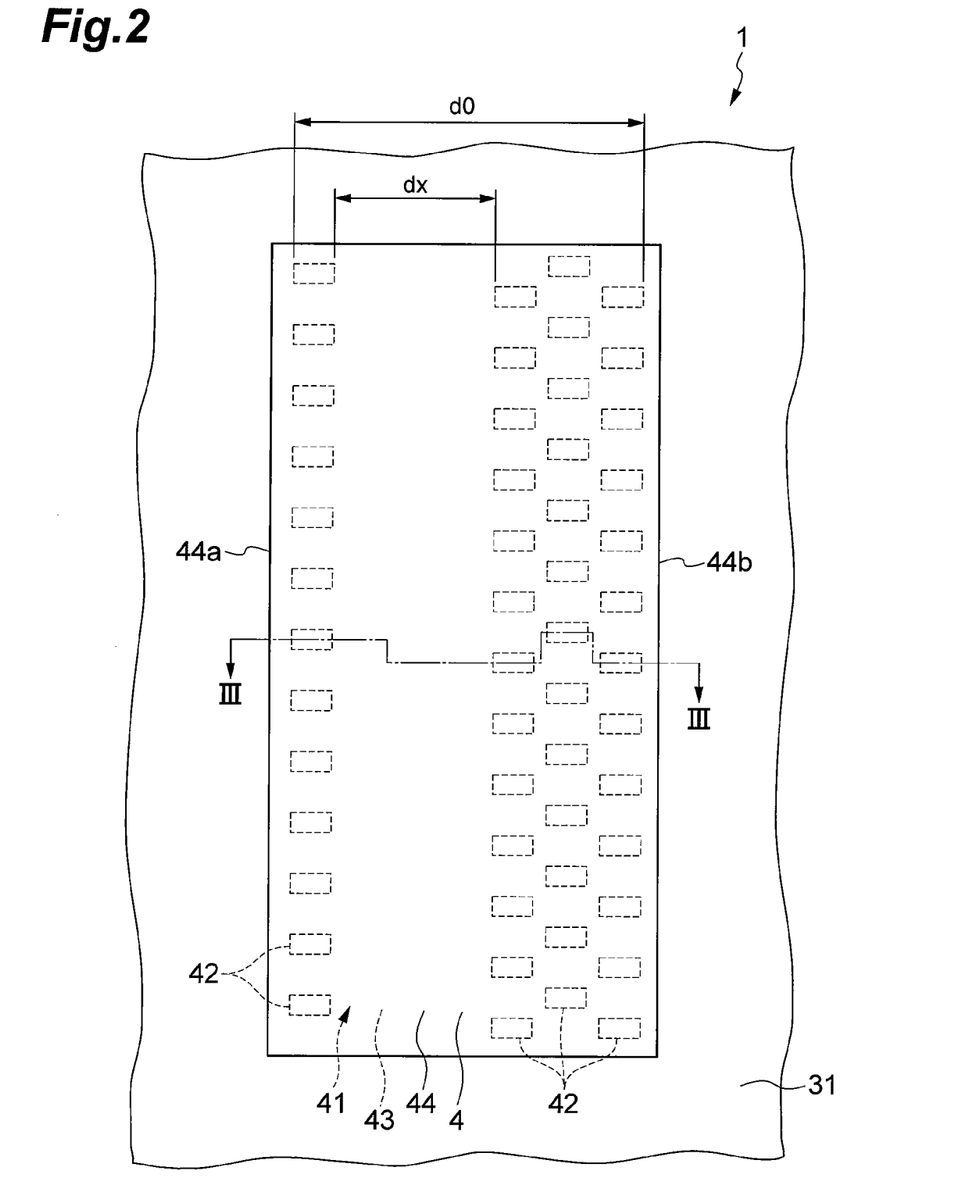
FIG. 2 is a plan view illustrating the circuit component of FIG. 1.
Figure 3:
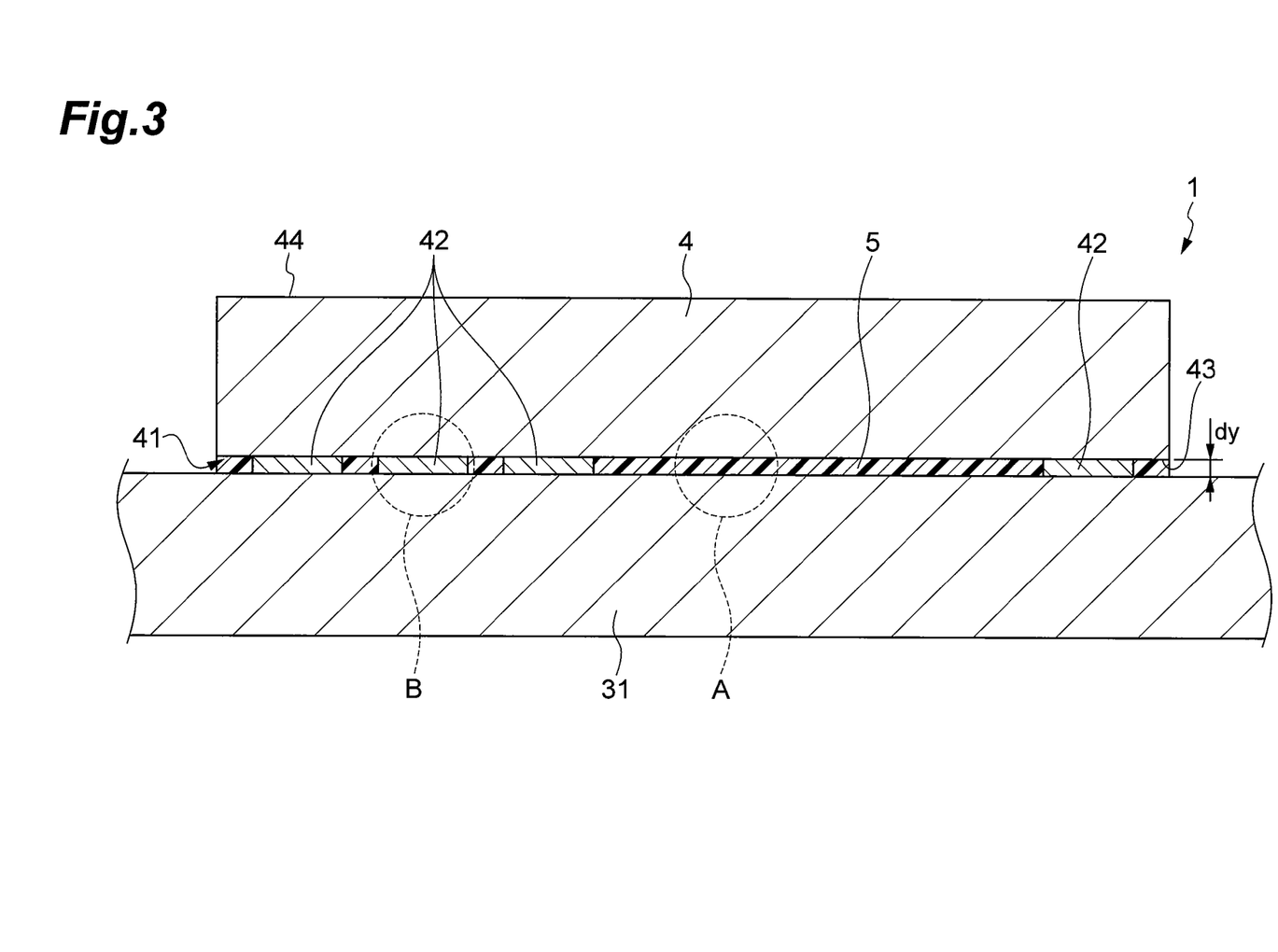
FIG. 3 is a schematic cross-sectional view taken by an arrow III-III in FIG. 2.

FIG. 1 is a plan view illustrating an electronic device to which the circuit component according to the embodiment is applied, FIG. 2 is a plan view illustrating the circuit component of FIG. 1, and FIG. 3 is a schematic cross-sectional view taken by an arrow III-III in FIG. 2. Note that, in FIG. 3, electrically conductive particles contained in an electrically conductive adhesive 5 to be described later are omitted.

As illustrated in FIG. 1, a circuit component 1 is applied to, for example, an electronic device 2 such as a touch panel. The electronic device 2 includes a liquid crystal panel 3 and an IC chip 4.

The liquid crystal panel 3 includes a glass substrate 31 and a liquid crystal display part 32. The glass substrate 31 has a rectangular plate-like shape, and has a surface 33 on which circuit electrodes (not illustrated) are formed so as to correspond to the liquid crystal display part 32 and bump electrodes 42 (to be described later) of the IC chip 4. Examples of the metal used to form the circuit electrodes include: an alloy (such as an alloy containing aluminum and neodymium or an alloy containing aluminum, neodymium, and molybdenum); and a multilayer metal layer (such as a three-layer metal layer with an aluminum layer between two titanium layers). The circuit electrodes are covered by an indium-tin oxide (ITO), an indium-zinc oxide (IZO), or the like. The size of the glass substrate 31 is, for example, approximately 20 to 300 mm×20 to 400 mm, and the thickness thereof is, for example, approximately 0.1 to 0.3 mm, that is, the glass substrate 31 has a relatively large size and small thickness. The thickness of the circuit electrodes is, for example, approximately 100 to 200 nm. Examples of the material used to form the glass substrate 31 include alkali-free glass. The liquid crystal display part 32 is attached to the surface 33 of the glass substrate 31, and is connected to the above-mentioned circuit electrodes.

The IC chip 4 is an electronic component having a rectangular plate-like shape smaller than that of the glass substrate 31, and is attached to the surface 33 of the glass substrate 31. The IC chip 4 is placed apart from the liquid crystal display part 32, and is connected to the above-mentioned circuit electrodes of the glass substrate 31. Then, as illustrated in FIG. 3, the circuit component 1 is formed by interposing the electrically conductive adhesive 5 containing the electrically conductive particles between the IC chip 4 and the glass substrate 31 and pressure-bonding and connecting the IC chip 4 and the glass substrate 31 to each other (the detailed procedures will be described later).

The size of the IC chip 4 is, for example, approximately 0.6 to 3.0 mm×10 to 40 mm, and the thickness thereof is, for example, approximately 0.1 to 0.3 mm, that is, the IC chip 4 has a relatively large size and small thickness similarly to the glass substrate 31. The IC chip 4 has a surface facing the glass substrate 31, as a mounting surface 41. The plurality of bump electrodes 42 are formed on the mounting surface 41 so as to protrude therefrom. Further, a portion of the mounting surface 41 other than the portion in which the bump electrodes 42 are formed is a non-electrode surface 43. A surface opposite to the mounting surface 41 is a non-mounting surface 44. Examples of the material used to form a main portion of the IC chip 4 include silicon. Further, examples of the material used to form the bump electrodes 42 include Au, and the bump electrodes 42 are softer than the electrically conductive particles contained in the electrically conductive adhesive 5.

As illustrated in FIG. 2, the plurality of bump electrodes 42 are placed in one line at substantially regular intervals along one longer side 44a of the mounting surface 41. Further, the plurality of bump electrodes 42 are placed in a three-line zigzag pattern at substantially regular intervals along another longer side 44b of the mounting surface 41. An interval dx is provided between the line of the bump electrodes 42 along the longer side 44a and the lines of the bump electrodes 42 along the longer side 44b. Note that the bump electrodes 42 placed in one line along the longer side 44a are input-side electrodes, and the bump electrodes 42 placed in three lines along the longer side 44b are output-side electrodes. The height (the height from the non-electrode surface 43) of the bump electrodes 42 is, for example, approximately 2 to 5 μm. From a different point of view, the IC chip 4 has a rectangular plate-like shape, and the plurality of bump electrodes 42 are placed apart from one another in the width direction (the shorter side direction, the left-right direction in FIG. 2) of the IC chip 4. In the width direction of the IC chip 4, the ratio of: the interval dx (which is the largest interval of the intervals between inner ends of neighboring bump electrodes 42 and 42); to an interval d0 (between outer ends of bump electrodes 42 and 42 placed on both the outermost sides) is 0.3 to 0.9.

[Electrically Conductive Adhesive]

Next, the electrically conductive adhesive 5 that connects the glass substrate 31 and the IC chip 4 to each other is described in detail. A wide variety of heat or light curing materials can be adopted as adhesive components of the electrically conductive adhesive 5, and examples thereof include an epoxy adhesive and an acrylic adhesive. Further, it is preferable to use a crosslinkable material because of its excellent resistance to heat and humidity after connection. Especially an epoxy adhesive containing an epoxy resin (heat curing resin) as its chief component is preferable because the epoxy adhesive can cure in a short time to provide good connection workability and is excellent in adhesiveness in terms of its molecular structure.

Specific examples of the epoxy adhesive include adhesives containing, as their chief component, high molecular weight epoxy, solid epoxy, liquid epoxy, or epoxy obtained by denaturing these epoxies using urethane, polyester, acrylic rubber, nitrile rubber (NBR), synthetic linear polyamide, and the like. General epoxy adhesives are formed by adding a curing agent, a catalyst, a coupling agent, a filler, and the like to the epoxy containing such a chief component as described above.

Specific examples of the acrylic adhesive include polymers and copolymers containing, as their monomer component, at least one of acrylic acid, acrylic acid ester, methacrylic acid ester, and acrylonitrile.

Note that it is preferable to blend components capable of alleviating internal stress with the adhesive components, from the point of view of suppressing warpage of the glass substrate 31 caused by a difference between the linear expansion coefficient of the IC chip 4 and the linear expansion coefficient of the glass substrate 31. Specifically, it is preferable to blend acrylic rubber, elastomer components or the like with the adhesive components. Further, it is also possible to use such a radical curing adhesive as described in International Publication No. WO 98/44067.

Examples of the electrically conductive particles contained in the electrically conductive adhesive 5 include: metal particles of Au, Ag, Pt, Ni, Cu, W, Sb, Sn, and solder; and carbon particles. It is also possible to use coated particles formed by coating a core made of electrically non-conductive glass, ceramic, plastic, or the like, with the above-mentioned metals or carbon. Examples of the shape of the electrically conductive particles before pressure-bonding include: a substantially spherical shape; and a shape (star-like shape) having a plurality of protrusions that protrude in the radial direction. It is preferable that an average particle diameter da of the electrically conductive particles before pressure-bonding be approximately 1 to 18 μm, from the point of view of dispersibility and electrical conductivity, and the average particle diameter da is set to approximately 2 to 4 μm herein. Within this range, it is preferable to select electrically conductive particles having the average particle diameter da larger than the height of the bump electrodes 42. Note that the electrically conductive particles may have the average particle diameter da slightly (approximately 20%) smaller than the height of the bump electrodes 42. This is because, in the case where the average particle diameter da of the electrically conductive particles is smaller than the height of the bump electrodes 42, although the IC chip 4 can warp slightly toward the glass substrate 31 due to thermal shrinkage or cure shrinkage of the electrically conductive adhesive, this warpage makes the interval between the surface 33 of the glass substrate 31 and the non-electrode surface 43 of the IC chip 4 smaller, and the electrically conductive particles thus come into contact, resulting in suppression of further warpage. Here, the average particle diameter is defined as, for example, an average diameter obtained using a Coulter counter. Note that it is possible to use insulating coated particles formed by coating electrically conductive particles with an insulating layer, and it is also possible to use both electrically conductive particles and insulating particles from the point of view of enhancing insulating properties of neighboring electrodes.

The blend ratio of the electrically conductive particles in the electrically conductive adhesive 5 is, for example, 0.1 to 30 parts by volume to 100 parts by volume of the adhesive components contained in the adhesive layer, from the point of view of a connection resistance and short-circuiting between electrodes, and the blend ratio thereof is set to 5 to 20 parts by volume herein. Within this range, the number of electrically conductive particles captured by the bump electrodes 42 can be adjusted to be at least three.

[Electrically Conductive Particles]

Figure 4:
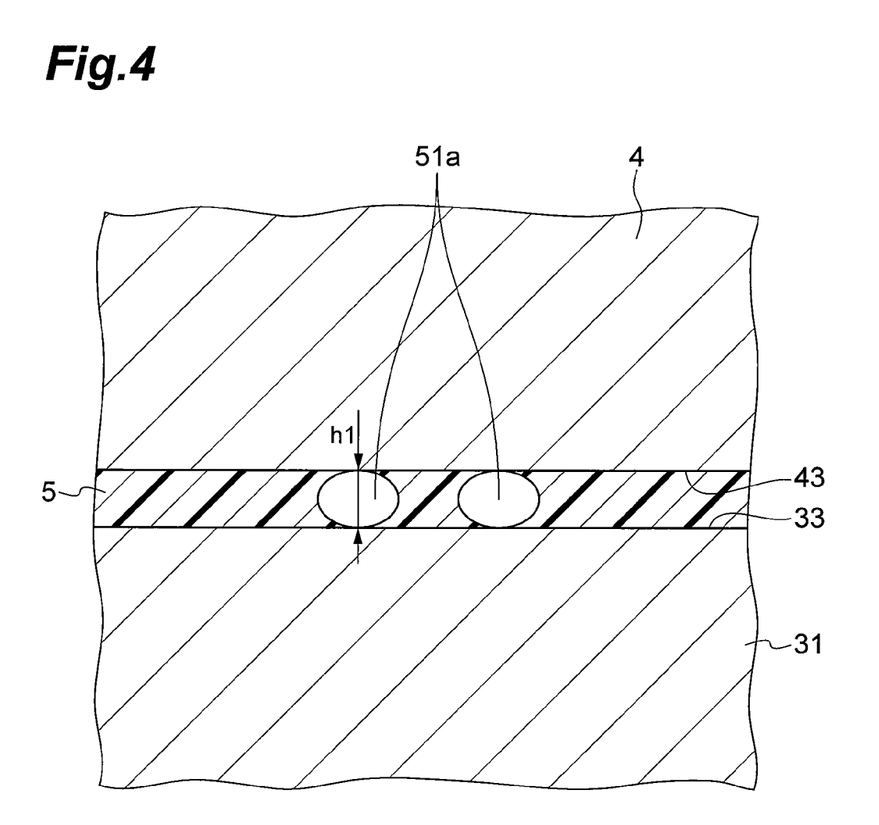
FIG. 4 is a cross-sectional view illustrating a portion A in FIG. 3.

Next, the electrically conductive particles interposed between the substrate 31 and the IC chip 4 in the circuit component 1 are described in detail. FIG. 4 is a cross-sectional view illustrating a portion A in FIG. 3, and FIGS. 5A and 5B are cross-sectional views each illustrating a portion B in FIG. 3.

As illustrated in FIG. 4, electrically conductive particles 51a are placed between the surface 33 of the glass substrate 31 and the non-electrode surface 43. The electrically conductive particles 51a are slightly compressed in the height direction of the bump electrode 42 by the surface 33 and the non-electrode surface 43, and are in a first state in which the electrically conductive particles 51a are in contact with both the surface 33 and the non-electrode surface 43. That is, the electrically conductive particles 51a have a size h1 in the height direction of the bump electrode 42, and the size h1 is substantially coincident with the interval between the surface 33 of the glass substrate 31 and the non-electrode surface 43. Electrically conductive particles that are not in the first state (electrically conductive particles that are not in contact with at least one of the surface 33 and the non-electrode surface 43) may exist between the surface 33 of the glass substrate 31 and the non-electrode surface 43.

Figure 5:
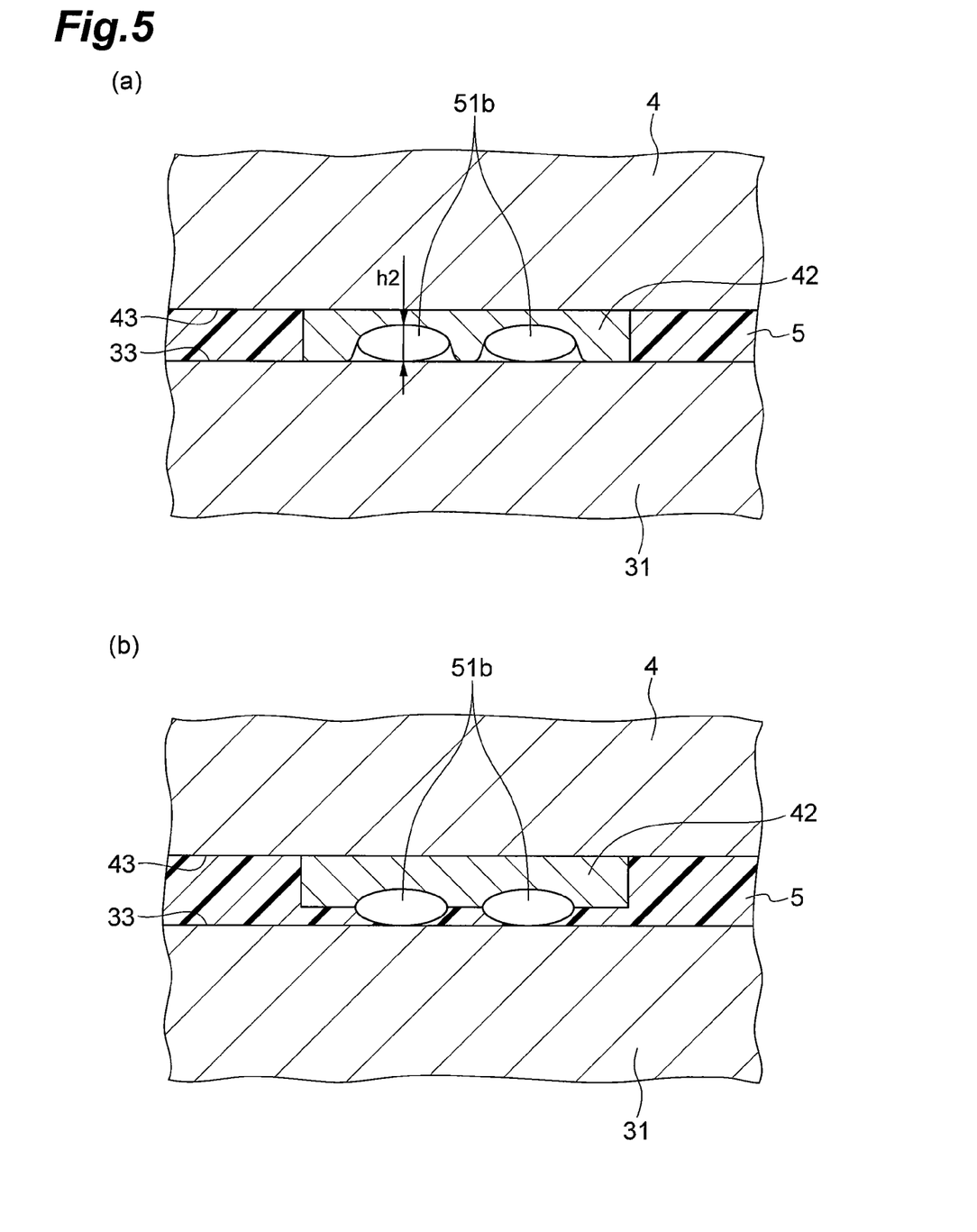
FIGS. 5A and 5B are cross-sectional views each illustrating a portion B in FIG. 3.

As illustrated in FIG. 5A, electrically conductive particles 51b are placed between the surface 33 of the glass substrate 31 and the bump electrode 42 that are in contact with each other. As described above, the bump electrode 42 is softer than the electrically conductive particles, and hence, at the time of pressure-bonding, the bump electrode 42 compresses the electrically conductive particles 51b and deforms so as to fit the electrically conductive particles 51b. Consequently, the electrically conductive particles 51b are interposed between the surface 33 of the glass substrate 31 and the bump electrode 42 while digging into the bump electrode 42. Then, the electrically conductive particles 51b are compressed in the height direction of the bump electrode 42 by the surface 33 and the bump electrode 42, and are in a second state in which the electrically conductive particles 51b are more flattened than the electrically conductive particles 51a in the first state. In such a case as described above where the electrically conductive particles 51b that are in the second state more flattened than the first state sufficiently dig into the bump electrode 42, the glass substrate 31 and the IC chip 4 are satisfactorily connected to each other. Note that, as illustrated in FIG. 5B, gap may exist between the surface 33 of the glass substrate 31 and the bump electrode 42. Even in this case, connection between the glass substrate 31 and the IC chip 4 is satisfactorily secured by the electrically conductive particles 51b. Electrically conductive particles that are not in the second state (electrically conductive particles that are not more flattened than the first state) may exist between the surface 33 of the glass substrate 31 and the bump electrode 42.

[Method of Making Circuit Component]

Next, the method of making the circuit component is described.

Figure 6:
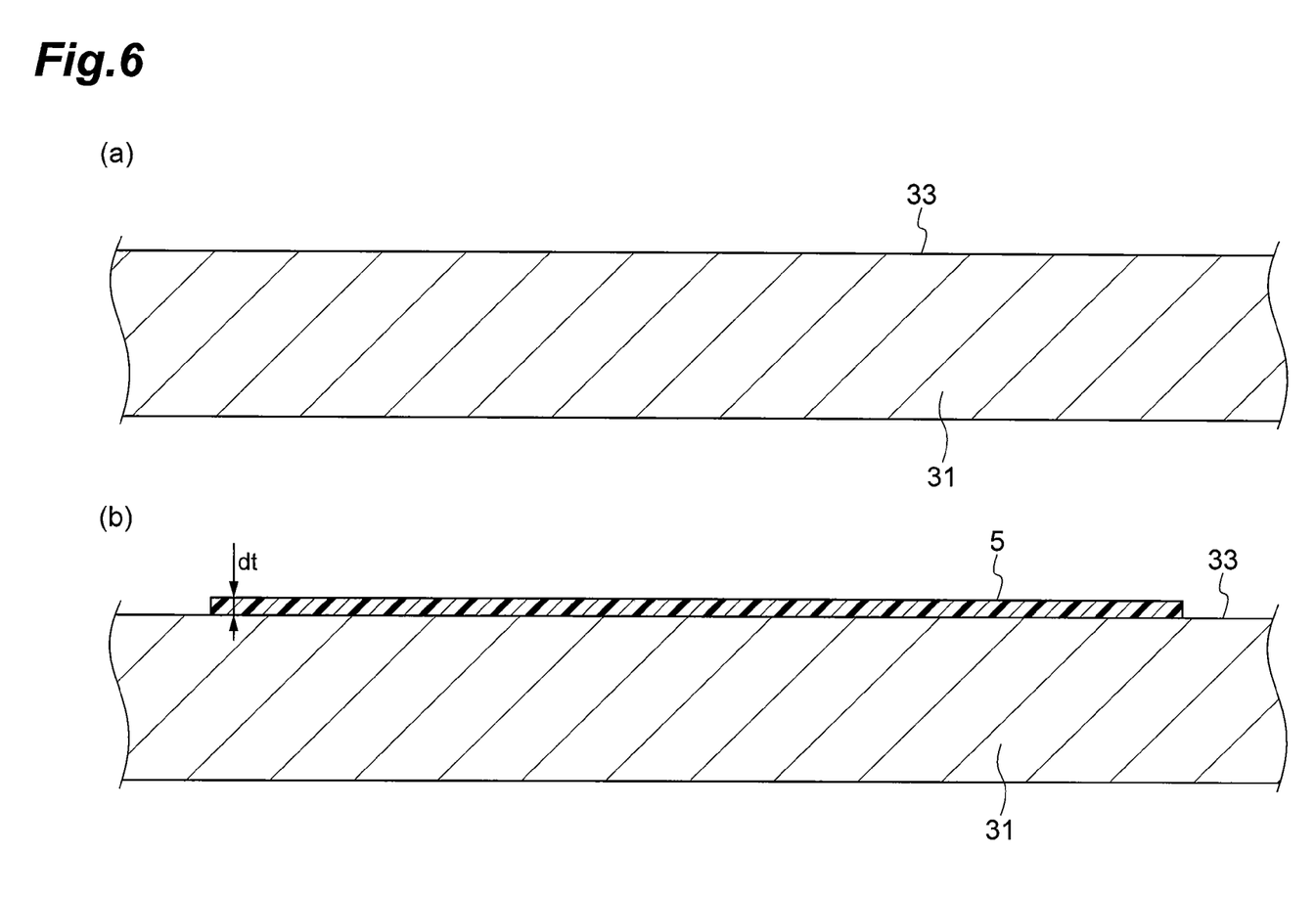
FIGS. 6A and 6B are schematic cross-sectional views each illustrating a method of making a circuit component according to the embodiment.
Figure 7:
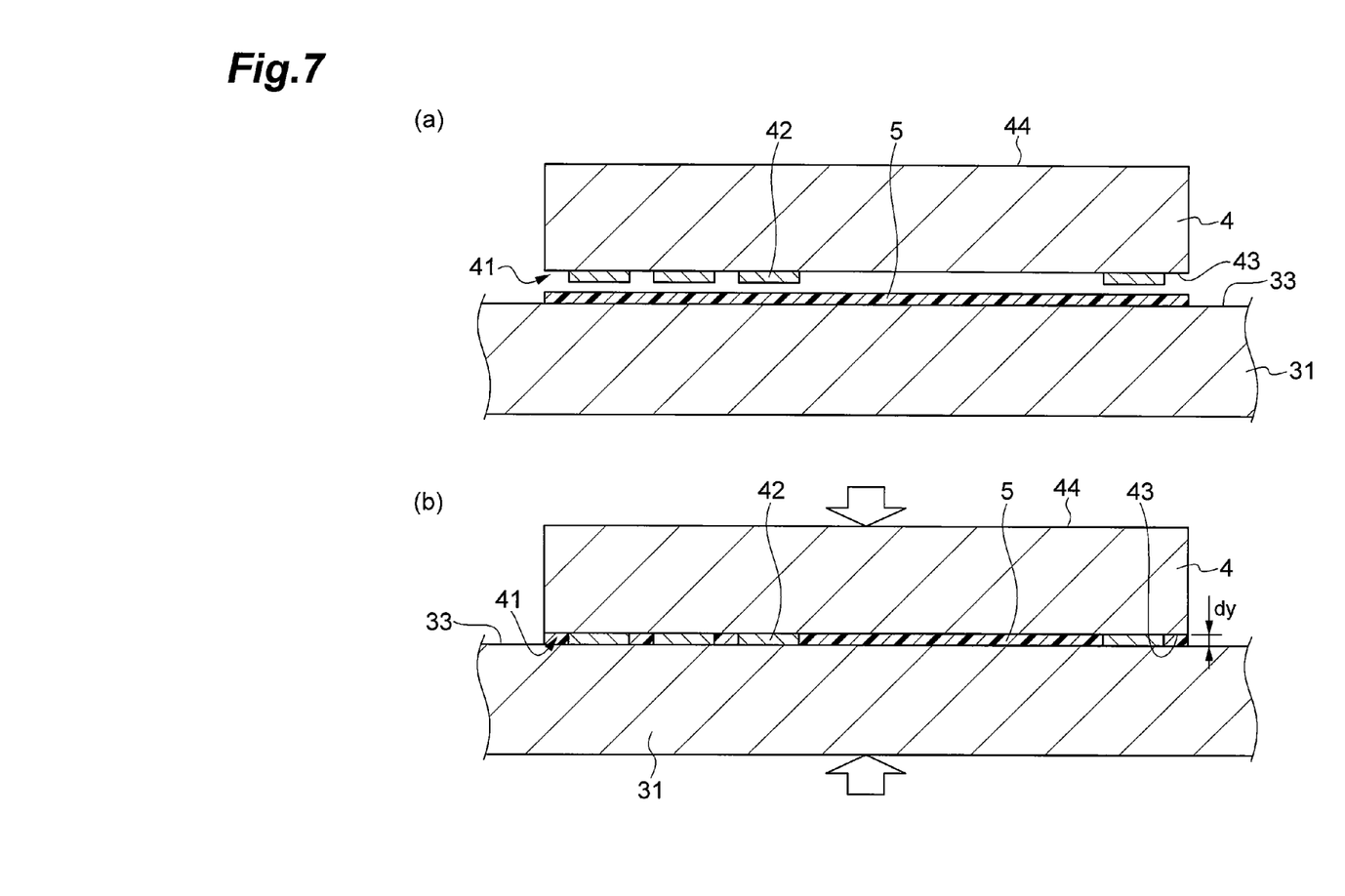
FIGS. 7A and 7B are schematic cross-sectional views each illustrating the making method subsequently to that of FIG. 6B.

FIGS. 6A and 6B are schematic cross-sectional views each illustrating the method of making the circuit component according to the embodiment, and FIGS. 7A and 7B are schematic cross-sectional views each illustrating the making method subsequently to that of FIG. 6B. Note that, in FIGS. 6A and 6B and FIGS. 7A and 7B, the electrically conductive particles contained in the electrically conductive adhesive 5 are omitted similarly to FIG. 3.

First, as illustrated in FIG. 6A, the glass substrate 31 is prepared.

Next, as illustrated in FIG. 6B, the electrically conductive adhesive 5 is placed on the surface 33 of the glass substrate 31. At this time, a thickness dt of the electrically conductive adhesive 5 is preferably 80% or more and 200% or less of the average particle diameter da of the electrically conductive particles before pressure-bonding, more preferably 95% or more and 160% or less thereof, and still more preferably 100% or more and 130% or less thereof. Within this range, the amount of the electrically conductive adhesive 5 that is pushed away by the bump electrodes 42 at the time of the pressure-bonding can correspond to a height that is substantially the same as the average particle diameter da (approximately 80% or more and 200% or less of the average particle diameter da) of the electrically conductive particles, resulting in a reduction of the amount of the electrically conductive adhesive 5 that flows out from between the bump electrodes 42 and the glass substrate 31 to lateral portions of the bump electrodes 42.

Next, as illustrated in FIG. 7A, the IC chip 4 is prepared, and the mounting surface 41 of the IC chip 4 is caused to face the surface 33 of the glass substrate 31 with the intermediation of the electrically conductive adhesive 5.

Next, as illustrated in FIG. 7B, the glass substrate 31 and the IC chip 4 are pressure-bonded and connected to each other. At this time, an interval dy between the surface 33 of the glass substrate 31 and the non-electrode surface 43 of the IC chip 4 is preferably 70% or more and 100% or less of a maximum particle diameter $d_{99}$, more preferably 80% or more and 98% or less thereof, and still more preferably 90% or more and 95% or less thereof. The maximum particle diameter $d_{99}$ refers to a maximum particle diameter of electrically conductive particles other than the electrically conductive particles whose particle diameter is in the top 1%, of all the electrically conductive particles contained in the electrically conductive adhesive 5. In other words, the size h1 (see FIG. 4) in the height direction of the bump electrodes 42, of the electrically conductive particles 51a interposed between the surface 33 of the glass substrate 31 and the non-electrode surface 43 is preferably 70% or more and 100% or less of the maximum particle diameter $d_{99}$, more preferably 80% or more and 98% or less thereof, and still more preferably 90% or more and 95% or less. Within this range, the electrically conductive particles 51a can be adequately compressed by the surface 33 of the glass substrate 31 and the non-electrode surface 43, and the electrically conductive particles 51a can be satisfactorily sandwiched between the surface 33 and the non-electrode surface 43. Note that the maximum particle diameter $d_{99}$ can be determined, for example, in the following manner. That is, first, the particle diameter distribution of electrically conductive particles to be contained in the electrically conductive adhesive 5 is measured using a Coulter counter. Then, larger top 1% particle diameters of all the measured particle diameters are excluded, and the maximum particle diameter of the other 99% particle diameters can be determined as the maximum particle diameter $d_{99}$.

Further, at the time of the pressure-bonding, the size h2 (see FIG. 5A) in the height direction of the bump electrodes 42, of the electrically conductive particles 51b interposed between the bump electrodes 42 and the surface 33 of the glass substrate 31 is preferably 15% or more and 80% or less of the average particle diameter da of the electrically conductive particles before the pressure-bonding, and more preferably 30% or more and 80% or less thereof. Within this range, the balance between deformation of the electrically conductive particles 51b caused by the pressure-bonding and digging thereof into the bump electrodes 42 is excellent.

Note that, at the time of the pressure-bonding, when the electrically conductive particles 51b dig into the bump electrodes 42 and the bump electrodes 42 and the glass substrate 31 are satisfactorily connected to each other, compression traces formed by the electrically conductive particles 51b that have dug into the bump electrodes 42 are observed from the surface (non-mounting surface) opposite to the surface 33 of the glass substrate 31, at positions corresponding to the bump electrodes 42. Accordingly, in order to determine whether or not the bump electrodes 42 and the glass substrate 31 are satisfactorily connected to each other, it is sufficient to check, from the non-mounting surface of the glass substrate 31, whether or not such compression traces are formed at the positions corresponding to the bump electrodes 42.

According to the circuit component 1 as described above, at the time of making the circuit component 1, at the interval dx (see FIG. 2) between the line of the bump electrodes 42 along the longer side 44a and the lines of the bump electrodes 42 along the longer side 44b, when the glass substrate 31 and the IC chip 4 are pulled toward each other and thus warped by thermal shrinkage or cure shrinkage of the electrically conductive adhesive 5 that fills the space between the surface 33 of the glass substrate 31 and the non-electrode surface 43, the electrically conductive particles 51a in the first state that are placed so as to be in contact with both the surface 33 of the glass substrate 31 and the non-electrode surface 43 counteract the warpage of the glass substrate 31 and the IC chip 4. As a result, the warpage of the glass substrate 31 and the IC chip 4 is suppressed.

In other words, in the circuit component 1, the size h1 in the height direction of the bump electrodes 42, of the electrically conductive particles 51a interposed between the surface 33 of the glass substrate 31 and the non-electrode surface 43 is substantially coincident with the interval between the surface 33 of the glass substrate 31 and the non-electrode surface 43, and hence the electrically conductive particles 51a are sandwiched between the surface 33 and the non-electrode surface 43. Accordingly, when the glass substrate 31 and the IC chip 4 are pulled toward each other and thus warped by thermal shrinkage or cure shrinkage of the electrically conductive adhesive 5 that fills the space between the surface 33 of the glass substrate 31 and the non-electrode surface 43, the electrically conductive particles 51a sandwiched between the surface 33 of the glass substrate 31 and the non-electrode surface 43 counteract the deformation of the glass substrate 31 and the IC chip 4. As a result, the warpage of the glass substrate 31 and the IC chip 4 is suppressed.

Figure 8:
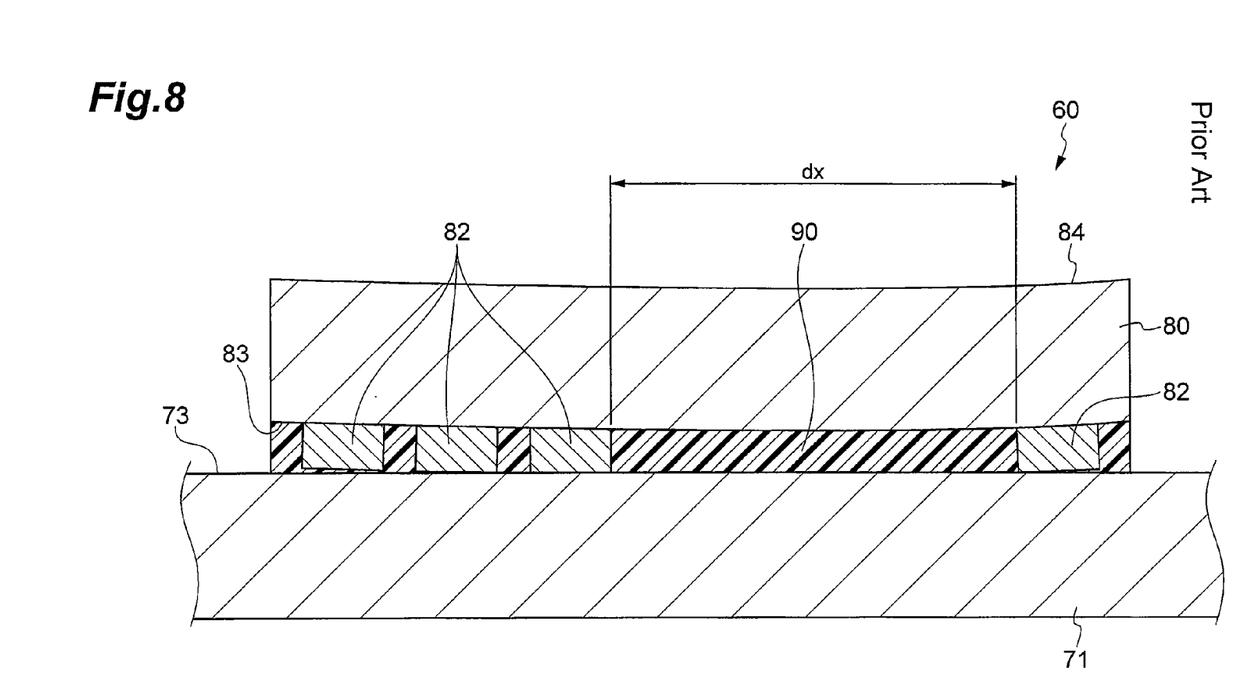
FIG. 8 is a schematic cross-sectional view illustrating a conventional circuit component.
Figure 9:
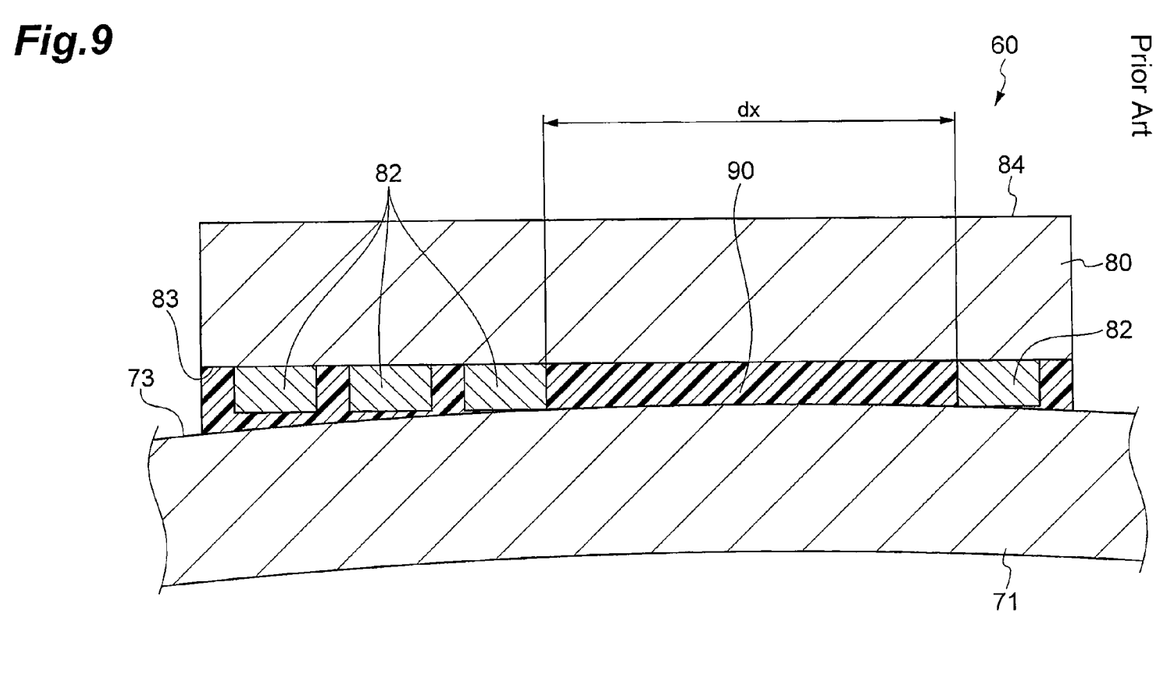
FIG. 9 is a schematic cross-sectional view illustrating the conventional circuit component.
Figure 10:
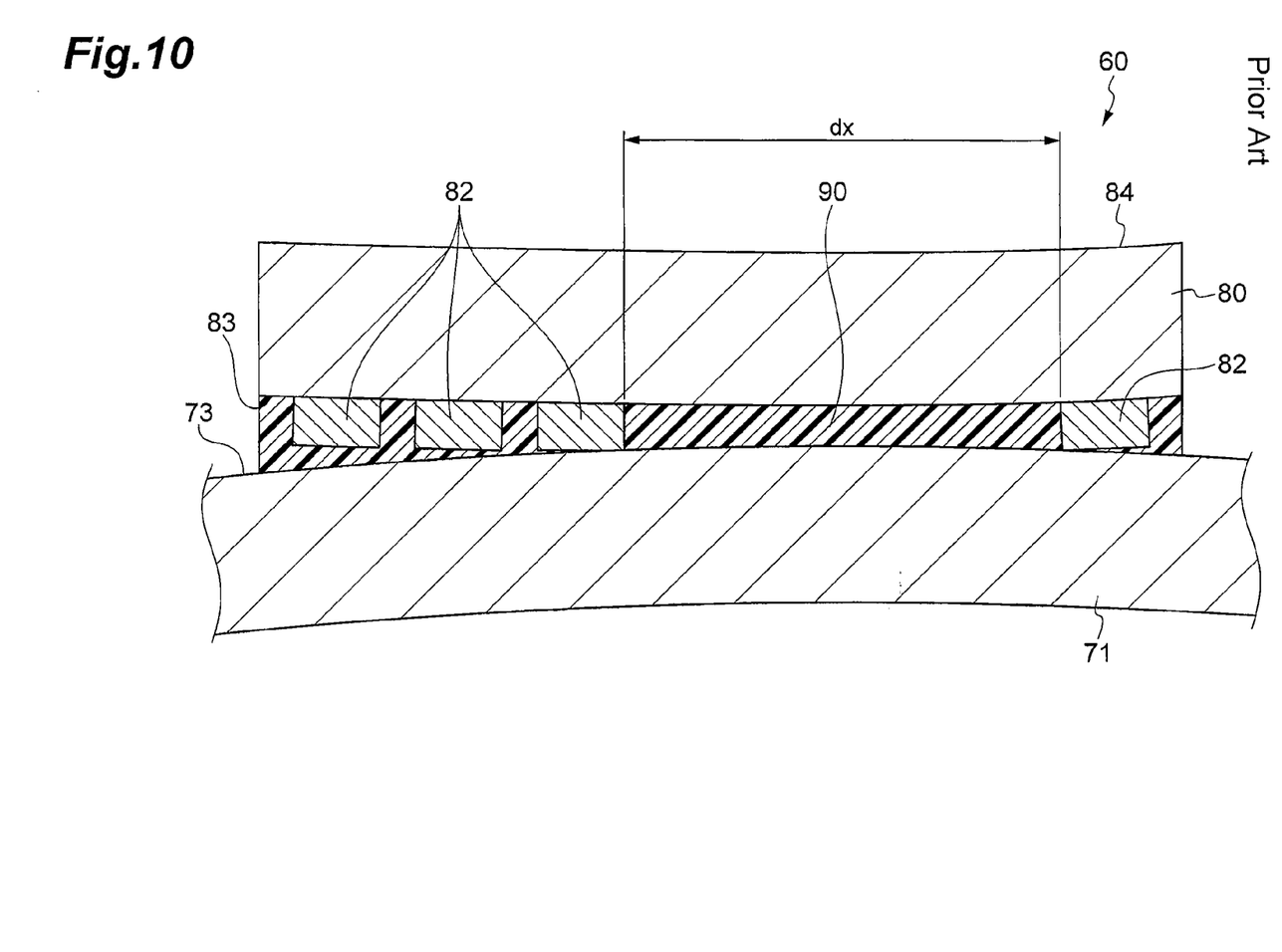
FIG. 10 is a schematic cross-sectional view illustrating the conventional circuit component.

Now, FIG. 8, FIG. 9, and FIG. 10 are schematic cross-sectional views each illustrating a conventional circuit component. Note that, in FIG. 8, FIG. 9, and FIG. 10, electrically conductive particles contained in an electrically conductive adhesive 90 are omitted similarly to FIG. 3.

As illustrated in FIG. 8, FIG. 9, and FIG. 10, in a conventional circuit component 60, the height of bump electrodes 82 of an IC chip 80 is larger than that of the bump electrodes 42 (see FIG. 3) in the circuit component 1 according to the present embodiment, and is larger than the average particle diameter of the electrically conductive particles contained in the electrically conductive adhesive 90. Accordingly, such electrically conductive particles that are in contact with both a surface 73 of a glass substrate 71 and a non-electrode surface 83 of the IC chip 80 are not interposed between the surface 73 and the non-electrode surface 83. Accordingly, at an interval dx between lines of the bump electrodes 82, when the electrically conductive adhesive 90 that fills the space between the surface 73 of the glass substrate 71 and the non-electrode surface 83 shrinks due to heat or curing, the glass substrate 71 and the IC chip 80 may be pulled toward each other and thus warped wholly. Note that FIG. 8 illustrates the case where the warpage of the IC chip 80 occurs, FIG. 9 illustrates the case where the warpage of the glass substrate 71 occurs, and FIG. 10 illustrates the case where the warpage of both the glass substrate 71 and the IC chip 80 occurs. For example, if the thicknesses of the IC chip 80 and the glass substrate 71 are substantially the same, as illustrated in FIG. 9, the warpage of the glass substrate 71 may occur. If any such warpage of the glass substrate 71 and the IC chip 80 occurs, the interval between the bump electrodes 82 placed on the outer sides and the surface 73 of the glass substrate 71 becomes larger, and the bump electrodes 82 and the glass substrate 71 may not be satisfactorily connected to each other. In this state, compression traces may not be observed at positions corresponding to the bump electrodes 82 placed on the outer sides, from the non-mounting surface of the glass substrate 71.

In contrast, in the circuit component 1 according to the present embodiment, the warpage of the glass substrate 31 and the IC chip 4 is suppressed as described above. Hence, the interval between the surface 33 of the glass substrate 31 and the bump electrodes 42 is suppressed from becoming larger, the electrically conductive particles 51b satisfactorily dig into the bump electrodes 42, and the glass substrate 31 and the bump electrodes 42 are satisfactorily connected to each other. In this way, the glass substrate 31 and the IC chip 4 can be satisfactorily connected to each other. Then, the electrically conductive particles 51b that have satisfactorily dug into the bump electrodes 42 form the compression traces, and hence it is possible to check, from the non-mounting surface of the glass substrate 31, that the glass substrate 31 and the IC chip 4 are satisfactorily connected to each other.

Further, in general, glass substrates are relatively hard, and hence such a connection failure as described above due to warpage of a glass substrate and an IC chip is less likely to occur, unless a circuit component is thin. In contrast, in the circuit component 1 according to the present embodiment, the glass substrate 31 is thin. In this case, warpage of the glass substrate 31 is likely to occur, and hence an effect of the present invention, that is, an effect of suppressing warpage of the substrate and the IC chip can be more exerted. Further, in the circuit component 1 according to the present embodiment, the IC chip 4 is large (the length in the width direction of the IC chip 4 (the length thereof in the top-bottom direction in FIG. 1) is large). In this case, warpage is more likely to occur, and hence an effect of the present invention, that is, an effect of suppressing warpage can be still more exerted. Still further, in the circuit component 1 according to the present embodiment, in the width direction of the IC chip 4, the ratio of: the interval dx (which is the largest interval of the intervals between inner ends of neighboring bump electrodes 42 and 42); to the interval d0 (between outer ends of bump electrodes 42 and 42 placed on both the outermost sides) is 0.3 to 0.9, in other words, the relatively large interval dx exists. In this case, warpage is more likely to occur, and hence an effect of the present invention, that is, an effect of suppressing warpage can be still more exerted.

Meanwhile, in the method of making the circuit component 1 according to the present embodiment, the glass substrate 31 and the IC chip 4 are connected to each other using the electrically conductive adhesive 5 containing the electrically conductive particles each having an average particle diameter larger than the height of the bump electrodes 42 of the IC chip 4. Accordingly, as described above, the electrically conductive particles 51a interposed between the surface 33 of the glass substrate 31 and the non-electrode surface 43 are compressed to the height of the bump electrodes 42, and are sandwiched between the non-electrode surface 43 and the surface 33 of the glass substrate 31. Then, when the glass substrate 31 and the IC chip 4 are pulled toward each other and thus deformed by thermal shrinkage or cure shrinkage of the electrically conductive adhesive 5 that fills the space between the surface 33 of the glass substrate 31 and the non-electrode surface 43, the electrically conductive particles 51a sandwiched between the non-electrode surface 43 and the surface 33 of the glass substrate 31 counteract the deformation of the glass substrate 31 and the IC chip 4, so that the warpage of the glass substrate 31 and the IC chip 4 is suppressed. Consequently, the interval between the bump electrodes 42 and the glass substrate 31 is suppressed from becoming larger, and the bump electrodes 42 and the glass substrate 31 are satisfactorily connected to each other. As a result, the glass substrate 31 and the IC chip 4 can be satisfactorily connected to each other.

Further, in the method of making the circuit component 1 according to the present embodiment, the electrically conductive adhesive 5 is interposed such that the thickness dt of the electrically conductive adhesive 5 before the pressure-bonding is 80% or more and 200% or less of the average particle diameter da of the electrically conductive particles before the pressure-bonding. Hence, the amount of the electrically conductive adhesive 5 that is pushed away by the bump electrodes 42 at the time of the pressure-bonding corresponds to a height that is substantially the same as the average particle diameter da (approximately 80% or more and 200% or less of the average particle diameter da) of the electrically conductive particles, resulting in a reduction of the amount of the electrically conductive adhesive 5 that flows out from between the bump electrodes 42 and the glass substrate 31 to lateral portions of the bump electrodes 42. Consequently, the electrically conductive particles 51b can be satisfactorily interposed between the bump electrodes 42 and the glass substrate 31. As a result, the glass substrate 31 and the IC chip 4 can be satisfactorily connected to each other.

Still further, in the method of making the circuit component 1 according to the present embodiment, the glass substrate 31 and the IC chip 4 are pressure-bonded to each other such that the interval dy after the pressure-bonding between the non-electrode surface 43 and the surface 33 of the glass substrate 31 is 70% or more and 100% or less of the maximum particle diameter $d_{99}$ of electrically conductive particles other than the electrically conductive particles whose particle diameter is in the top 1%, of all the electrically conductive particles. Hence, the electrically conductive particles 51a can be adequately compressed by the surface 33 of the glass substrate 31 and the non-electrode surface 43, and can be satisfactorily sandwiched between the surface 33 of the glass substrate 31 and the non-electrode surface 43. Accordingly, when the glass substrate 31 and the IC chip 4 are pulled toward each other and thus deformed by thermal shrinkage or cure shrinkage of the electrically conductive adhesive 5, the electrically conductive particles 51a satisfactorily sandwiched therebetween further counteract the deformation of the glass substrate 31 and the IC chip 4, and the warpage of the glass substrate 31 and the IC chip 4 is further suppressed. As a result, the glass substrate 31 and the IC chip 4 can be more satisfactorily connected to each other.

Still further, in the method of making the circuit component 1 according to the present embodiment, the glass substrate 31 and the IC chip 4 are pressure-bonded to each other such that the size h2 after the pressure-bonding in the height direction of the bump electrodes 42, of the electrically conductive particles 51b interposed by the pressure-bonding between the bump electrodes 42 and the surface 33 of the glass substrate 31 is 15% or more and 80% or less of the average particle diameter da of the electrically conductive particles before the pressure-bonding. Hence, the pressure-bonding enables the electrically conductive particles 51b to satisfactorily dig into the bump electrodes 42, and the glass substrate 31 and the IC chip 4 can be satisfactorily connected to each other.

Hereinabove, the circuit component and the method of making the circuit component according to the embodiment have been described, but the present invention is not limited to the above-mentioned embodiment. For example, in the above-mentioned embodiment, the glass substrate 31 is used as the substrate, and it is also possible to use, for example, a flexible tape including metal wiring, organic substrates such as a flexible printed wiring board, fiberglass reinforced organic substrates such as a fiberglass reinforced epoxy substrate, a paper phenol substrate, a ceramic substrate, and substrates such as a laminated plate.

Further, the rectangular plate-like shapes of the substrate and the IC chip include substantially rectangular plate-like shapes. Specifically, the rectangular plate-like shapes thereof include a chamfered shape and a shape having rounded corners.

What is claimed is:

1. A circuit component comprising:
   an IC chip; and
   a substrate;
   wherein the IC chip and the substrate are connected to each other via an electrically conductive adhesive containing electrically conductive particles,
   wherein the IC chip has a mounting surface on which a bump electrode and a non-electrode surface are provided, the non-electrode surface being a portion of the mounting surface other than a portion in which the bump electrode is formed,
   wherein electrically conductive particles in a first state exist between a surface of the substrate and the non-electrode surface, the first state being a state in which the electrically conductive particles are in contact with both the surface of the substrate and the non-electrode surface, and
   wherein electrically conductive particles in a second state exist between the surface of the substrate and the bump electrode, the second state being a state in which the electrically conductive particles are placed so as to be more flattened than the first state and dig into the bump electrode.

2. The circuit component according to claim 1, wherein the substrate is a glass substrate.

3. The circuit component according to claim 2,
   wherein an interval between the non-electrode surface and the surface of the substrate is 70% or more and 100% or less of a maximum particle diameter of a first part of the electrically conductive particles, wherein the first part of the electrically conductive particles does not include a second part of the electrically conductive particles that have a particle diameter in the top 1% of all the electrically conductive particles.

4. The circuit component according to claim 2, wherein the electrically conductive particles have a size in a height direction of the bump electrode, and wherein the size of the electrically conductive particles, in the height direction of the bump electrode, in the second state is 15% or more and 80% or less of the average particle diameter of the electrically conductive particles.

5. The circuit component according to claim 1, wherein an interval between the non-electrode surface and the surface of the substrate is 70% or more and 100% or less of a maximum particle diameter of a first part of the electrically conductive particles, wherein the first part of the electrically conductive particles does not include a second part of the electrically conductive particles that have a particle diameter in the top 1% of all the electrically conductive particles.

6. The circuit component according to claim 1, wherein the electrically conductive particles have a size in a height direction of the bump electrode, and wherein the size of the electrically conductive particles, in the height direction of the bump electrode, in the second state is 15% or more and 80% or less of the average particle diameter of the electrically conductive particles.

7. A circuit component comprising:
an IC chip; and
a substrate, wherein the IC chip and the substrate are connected to each other via an electrically conductive adhesive containing electrically conductive particles,
wherein the IC chip has a mounting surface on which a bump electrode and a non-electrode surface are provided, the non-electrode surface being a portion of the mounting surface other than a portion in which the bump electrode is formed, and
wherein electrically conductive particles having a size in a height direction of the bump electrode exist between a surface of the substrate and the non-electrode surface, the size being substantially coincident with an interval between the surface of the substrate and the non-electrode surface.

8. The circuit component according to claim 7, wherein the substrate is a glass substrate.

9. The circuit component according to claim 8, wherein an interval between the non-electrode surface and the surface of the substrate is 70% or more and 100% or less of a maximum particle diameter of a first part of the electrically conductive particles, wherein the first part of the electrically conductive particles does not include a second part of the electrically conductive particles that have a particle diameter in the top 1% of all the electrically conductive particles.

10. The circuit component according to claim 8, wherein the size of the electrically conductive particles, in the height direction of the bump electrode, in a second state, is 15% or more and 80% or less of the average particle diameter of the electrically conductive particles.

11. The circuit component according to claim 7, wherein an interval between the non-electrode surface and the surface of the substrate is 70% or more and 100% or less of a maximum particle diameter of a first part of the electrically conductive particles, wherein the first part of the electrically conductive particles does not include a second part of the electrically conductive particles that have a particle diameter in the top 1% of all the electrically conductive particles.

12. The circuit component according to claim 7, wherein the size of the electrically conductive particles, in the height direction of the bump electrode, in a second state, is 15% or more and 80% or less of the average particle diameter of the electrically conductive particles.

* * * * *